350-311.

SR 6-11-74 OR 3,815,978

United States Patent [19]

Marinace

[11] 3,815,978

[45] June 11, 1974

[54] DURABLE SEE-THROUGH PHOTORESIST MASK

[75] Inventor: John Carter Marinace, Yorktown Heights, N.Y.

[73] Assignee: International Business Machines Corporation, Armonk, N.Y.

[22] Filed: June 20, 1972

[21] Appl. No.: 264,653

[52] U.S. Cl. .................. 350/311, 355/125, 96/38.3, 350/311

[51] Int. Cl. .................. G03c 5/00, G03c 11/00

[58] Field of Search .................. 95/1; 355/125, 133; 96/38.3; 352/97; 350/311; 117/33.3

[56] References Cited

UNITED STATES PATENTS 3,508,982 4/1970 Shearin, Jr. .................. 93/38.3

3,561,963 2/1971 Kiba .................. 96/38.3 UX

*Primary Examiner*—Robert P. Greiner

*Attorney, Agent, or Firm*—John A. Jordan

[57] ABSTRACT

A durable "see-through" photoresist mask is obtained by forming a layer of ruby on a sapphire substrate, and forming a layer of $Cr_2O_3$ on the ruby. This combination of materials acts to effectively absorb light over the sensitive range of approximately 3,000 to 4,500 A, and yet allows transmission of sufficient light in the visible range to permit visual alignment and positioning of the mask. The mask is fabricated, in one mode, by depositing a layer of $Cr_2O_3 + Cr$ on a layer of sapphire and heating in an inert atmosphere to diffuse Cr into the sapphire and create a layer of ruby intermediate a layer of sapphire and $Cr_2O_3$.

16 Claims, 10 Drawing Figures

DURABLE SEE-THROUGH PHOTORESIST MASK

BACKGROUND OF THE INVENTION

1. Field of the Invention

The present invention relates to photoresist masks, and more particularly to durable "see-through" photoresist masks, and methods therefor.

One of the most common types of reusable photoresist mask consists of an opaque emulsion. In this type of mask, the emulsion is used in contact with the photoresist layer, on the substrate to be etched. There are two major drawbacks with the opaque emulsion type mask. First, the emulsion is relatively soft, and therefore, readily becomes scratched with use; at the present time they are discarded after several uses. Second, the emulsion is opaque, which makes alignment and positioning of the mask difficult.

In addition to the opaque emulsion type mask, there are a variety of other types of mask but, in the main, these latter types of mask have been much less widely employed. For example, in order to obviate the alignment difficulty of the opaque emulsion type mask, emulsion type masks which are transparent over the visible region, have been employed. Such masks are opaque in the shorter wavelength visible or near ultraviolet region, in which region photoresists are sensitive, but are transmissive in the long wavelength visible region. Although the transparent emulsion type mask facilitates mask positioning, scratching is still a problem.

In order to confront the scratching problem, other types of masks have been fabricated using a pattern of relatively hard metal, such as Cr, W, Ge, and Si on a glass plate. However, these latter metal-type masks still become scratched and, moreover, are opaque and, thus, makes alignment difficult.

In regard to the alignment problem, efforts have been made to employ the oxides of certain metals, in an endeavor to provide a transparent or semitransparent mask. For example, W. R. Sinclair et al describe in the February 1971 issue of J. Electro Chem. Society: Solid State Science, pp. 341 et seq., in an article entitled "Materials for Use in a Durable Selectively Semitransparent Photomask," several metal oxides as possible candidates for "see-through" mask materials. Likewise, J. B. McChesney et al describe in the May 1971 issue of the same journal, in an article entitled "Chemical Vapor Deposition of Iron Oxide Films For Use as Semitransparent Masks," techniques for fabricating oxide films, for use as "see-through" masks. However, the metal oxide masks thus far employed, do not provide the best optical characteristics, in that transmission occurs over certain undesirable ranges (i.e., in the shorter wavelength visible or near ultra-violet range). In addition, these metal oxide masks are still susceptible to scratching.

SUMMARY OF THE INVENTION

In accordance with the principles of the present invention, a highly effective and durable transparent or "see-through" photoresist mask is obtained by employing two different materials to give the desired optical absorption properties. In particular, $Cr_2O_3$ is employed with ruby on a transparent substrate to provide a mask which exhibits high absorption characteristics over the sensitive range of typical photoresists (e.g., 3,000 –

4,500 A), and yet allows enough longer wavelength light to pass through the mask pattern to permit "see-through" observation, for mask positioning and alignment.

Not only do $Cr_2O_3$ and ruby provide the proper optical absorption spectrum, but in addition, the elements of these two materials are such that they may readily be fabricated from two completely miscible and very hard materials. In particular, Cr and Al may readily be combined, by any of the several processes, to achieve a $Cr_2O_3$ layer on a co-extensive ruby layer. For example, a $Cr_2O_3$ + Cr layer may be deposited upon an $Al_2O_3$, such as sapphire. The layers are then heated and the Cr diffuses into the $Al_2O_3$ to provide a layer of ruby between a top $Cr_2O_3$ layer and a substrate $Al_2O_3$.

It is, therefore, an object of the present invention to provide an improved photoresist mask and methods relating thereto.

It is a further object of the present invention to provide an improved photoresist mask with "see-through" characteristics.

It is yet a further object of the present invention to provide an improved "see-through" photoresist mask which is durable, and extensively reusable.

It is yet still a further object of the present invention to provide a durable "see-through" mask which exhibits its absorption characteristics which are highly effective over the sensitive range of conventional photoresist materials.

It is another object of the present invention to provide a highly durable and reusable semitransparent photomask, and methods for fabricating same.

It is yet another object of the present invention to provide a durable semitransparent photomask utilizing a combination of materials which are readily miscible to provide a resultant photomask which exhibits highly effective optical masking properties and high durability, and yet is readily and conveniently fabricated.

The foregoing and other objects, features and advantages of the invention will be apparent from the following more particular description of preferred embodiments of the invention, as illustrated in the accompanying drawings.

DESCRIPTION OF THE PREFERRED EMBODIMENTS

It is known that the typical prior art photoresists, employed in semiconductor technology applications, for example, is sensitive over a range of approximately 3,000 to 4,500 A. In order to obtain an effective and durable "see-through" mask for such applications, it is clear that a mask must be obtained which is relatively hard and selectively transparent. In particular, such a mask must be strongly absorbent to the light used in the sensitive range of the exposure process, yet reasonably transparent to yellows, red or even green light, such as to allow viewing therethrough for alignment purposes.

In accordance with the principles of the present invention, a relatively hard $Al_2O_3$ starting material is initially employed in the fabrication of the mask. Typically, sapphire is the preferred form of $Al_2O_3$. However, it should be recognized that any of the variety of forms of $Al_2O_3$ may be employed. For example, where fine resolution is not an important consideration, a sintered polycrystalline sapphire, such as, LUCALOX may be employed. This latter material has an advantage over sapphire, which is single crystal $Al_2O_3$, in that it is less expensive. However, in the description provided in regard to FIGS. 1–4, sapphire will be used as the preferred example, since it provides good physical and optical characteristics for the above-mentioned application.

Figure 1A:
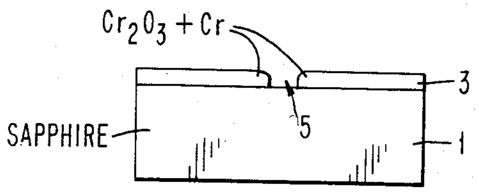
FIGS. 1A and 1B show one method of fabricating the photoresist mask, in accordance with the principles of the present invention.

As shown in FIG. 1A, a sapphire substrate 1 is coated with a layer 3 of $Cr_2O_3$ + Cr. Since $Cr_2O_3$ is somewhat difficult to etch, it is preferable to evaporate this layer on substrate 1, in the pattern desired, using a mechanical mask, such as a wire mask. However, a photoresist could first be deposited upon substrate 1 and a pattern made therefrom. Thereafter, the layer 3 of $Cr_2O_3$ + Cr could be deposited over the photoresist pattern and substrate layer 1, and the photoresist pattern subsequently removed to form the desired pattern in the $Cr_2O_3$ + Cr. Likewise, a patterned layer 3 of $Cr_2O_3$ + Cr could be deposited by selective CVD (Chemical Vapor Deposition). Although chemical etching of $Cr_2O_3$ is difficult, it should be recognized that sputter etching is possible. The notch 5 shown in the layer 3 in FIG. 1A is merely depicted to represent some arbitrary pattern that might be desired to be formed in the "see-through" photoresist mask, in accordance with the principles of the present invention. Likewise, the notch shown in the subsequent FIGS. 2–4 is intended merely to represent the manner by which some arbitrary pattern would be formed.

Figure 6:
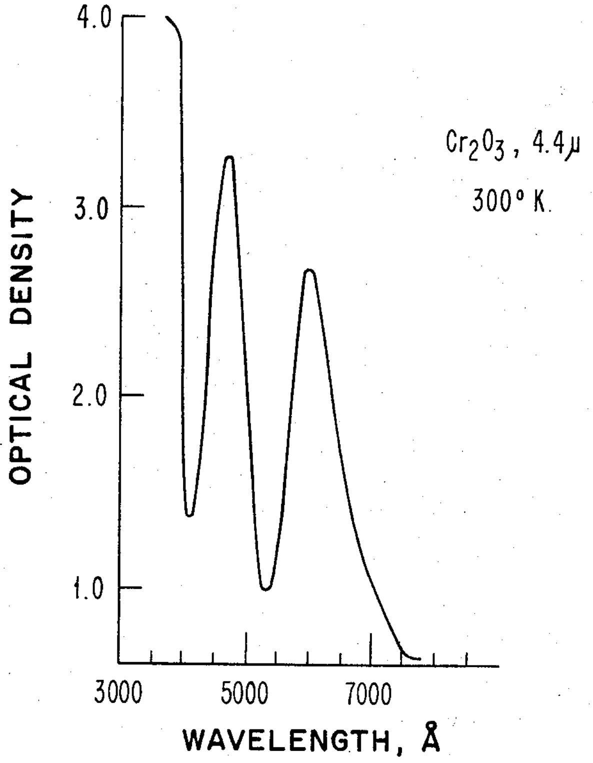

It should be appreciated that the significance of using some form of $Al_2O_3$, such as sapphire, resides in the fact that it is extremely hard, and is transparent in the long wavelength visible region as well as in the shorter wavelength visible or near ultra-violet region, in which the typical photoresists are sensitive. Specifically, sapphire exhibits a hardness of approximately 9 on the Mho scale, and exhibits transmittance which exceeds 90 percent throughout the visible region of energy normally incident thereon. Likewise, the significance of employing $Cr_2O_3$ resides in its approximately same degree of hardness, and its ability to absorb light within the sensitive range of typical photoresists. In particular, $Cr_2O_3$ has substantially the same hardness as sapphire; e.g., 9 on the Mho scale. $Cr_2O_3$ is a transparent green crystal, the optical absorption characteristics of which are shown in FIG. 6. There, it can be seen that $Cr_2O_3$ is highly absorbent in the range of approximately 3,000 to 3,700 A. After approximately 3,700 A, it can be seen that absorption drops off markedly. It is clear, that $Cr_2O_3$ transmits sufficiently within the visible region to provide "see-through" characteristics.

Figure 5:
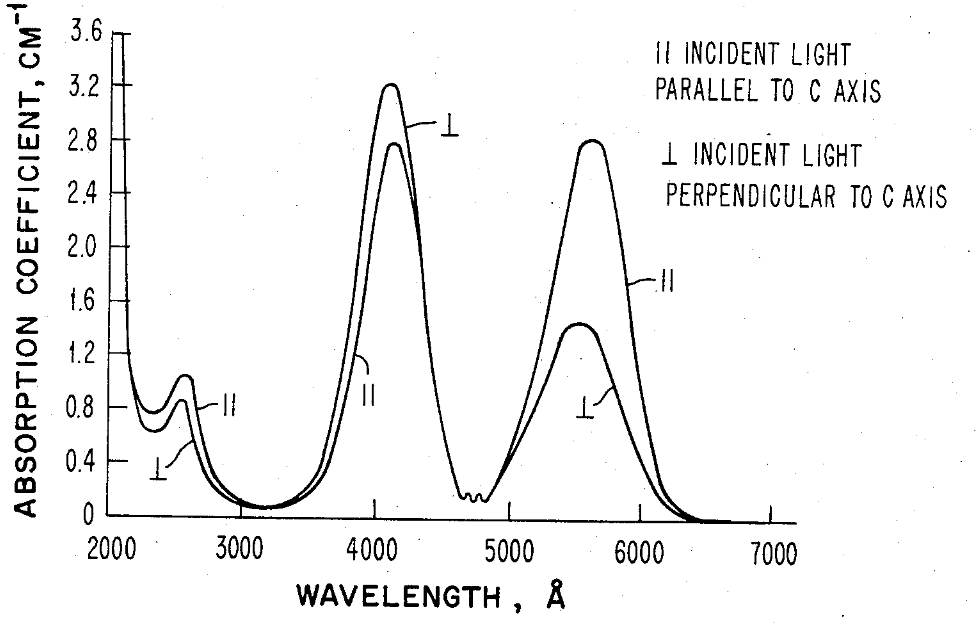
FIGS. 5 and 6 show the optical absorption characteristics of $Cr_2O_3$ and pink ruby, respectively.

It can be seen that the arrangement of FIG. 1A thus far described, provides a highly durable "see-through" mask which is effectively absorbent over approximately one-half of the sensitive range of the typical photoresist, i.e., from 3,000 to 3,700 A. In order to achieve absorption over the remainder of the range required for the typical photoresist, i.e., 3,700 – 4,500 A, there is provided, in accordance with the present invention, the further step of diffusing $Cr_2O_3$ + Cr into the underlying layer of $Al_2O_3$, in order to obtain an intermediate layer of ruby. In this regard, it should be recognized that $Al_2O_3$ and $Cr_2O_3$ are completely miscible over the entire composition range. More importantly, however, it should be recognized that the room temperature optical absorption characteristics of ruby are such as to complement those of $Cr_2O_3$ to provide the complete absorption spectrum characteristics required for the typical photoresists in question. This is shown more clearly with reference to FIG. 5. There, the absorption spectrum of pink ruby (0.05 percent by weight Cr) shows that a high absorption characteristic is exhibited within the range of 3,600 – 4,600 A. In this regard, it can be seen that the absorption characteristics within the range in question are quite similar whether the incident light is parallel to, or perpendicular with, the C axis of the ruby.

Although ruby is relatively absorbent within the range required to compliment the absorption range of $Cr_2O_3$ for purposes of providing a photoresist mask, ruby by the same token, transmits sufficient light in the visible range to allow "see-through" positioning. Thus, it can be seen that a mask pattern made of chromium concentrations below and above 8 mole percent, is effective to mask out light in the sensitive range of the typical photoresist, while at the same time is effective to pass through enough long wavelength light to permit a "see-through" characteristic. In this regard, it should be appreciated that sapphire doped with Cr (ruby) is red in color up to 8 mole per cent Cr, while in concentrations greater than 8 mole per cent it starts turning green.

In FIG. 1A there is shown the first step whereby a mask, in accordance with the principles of the present invention, may be achieved. It is clear, in this regard, that any variety of techniques may be employed whereby Cr and/or $Cr_2O_3$ may be diffused into a layer of $Al_2O_3$ to provide the desired intermediate layer of ruby. With regard to FIG. 1A the layer of $Cr_2O_3$ is provided with excess or free Cr to accommodate the diffusion of Cr into sapphire layer 1. However, it is clear that some free Cr may be taken or obtained from the $Cr_2O_3$. It should be noted that rather than deposit layer 3 of $Cr_2O_3$ + Cr, layer 3 may be deposited as Cr and then etched. Thereafter, the etched Cr may be oxidized and diffused with additional Cr, if desired.

Figure 1B:
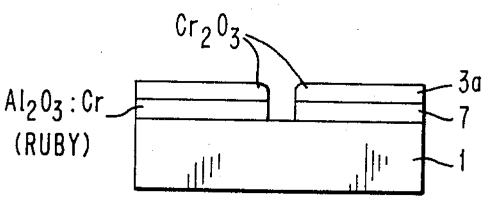

To diffuse the Cr of layer 3 into sapphire layer 1, the arrangement is heat-treated at temperatures between approximately 1,000° C and 1,500° C for several hours in an air or inert atmosphere. It should be understood that the diffusion of Cr into sapphire is somewhat slow and, thus, higher temperatures and greater quantities of Cr in layer 3 may be employed to increase the diffusion process. FIG. 1B depicts the "see-through" mask after this heat treatment, whereby chromium is diffused into a relatively thin region below layer 3 to give the chromium doped $Al_2O_3$ (ruby) layer 7.

It should be recognized, that FIGS. 1A-B represent one possible way whereby the "see-through" mask, in accordance with the principles of the present invention, may be fabricated. As an alternative form of fabrication, it should be appreciated that co-deposition of $Al_2O_3$ and $Cr_2O_3$ is also possible to produce the layer of Cr-doped $Al_2O_3$ and $Cr_2O_3$. In addition, Cr films on sapphire or LUCALOX may be oxidized, and then heat treated at high temperatures for extended periods of time.

Figure 2A:
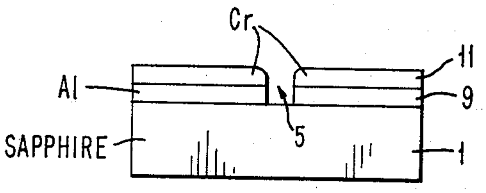
FIGS. 2A and 2B show a preferred mode of fabricating the photoresist mask, in accordance with the principles of the present invention.
Figure 2B:
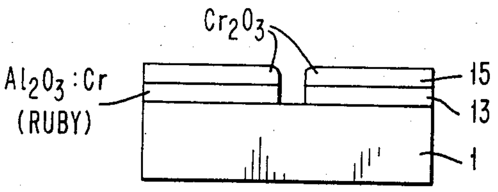

In FIG. 2A and 2B there is shown the steps of an alternative technique whereby the durable "see-through" photoresist mask, in accordance with the principles of the present invention, may be fabricated. As shown in FIG. 2A, sapphire substrate layer 1 is coated with layer 9 of Al. Thereafter, layer 9 is coated with a layer of Cr. The Al and Cr layers may then readily be etched to form the desired pattern therein, as represented by 5. The arrangement is then heated in an oxidizing atmosphere, whereby the desired compounds are formed. Specifically, after heating for several hours, at, say, 1,000° C, ruby layer 13 and $Cr_2O_3$ layer 15 are formed upon the sapphire substrate layer 1.

Although FIG. 2A shows Cr layer 11 deposited upon Al layer 9, it is clear that the converse arrangement may likewise be provided. In particular, the Cr layer 11 may first be deposited on sapphire layer 1, and then Al layer 9 deposited upon the Cr layer 11. In this regard, it should be noted that Cr on top of Al requires a shorter heat cycle to achieve the required $Cr_2O_3$ and ruby. It is, also clear that whatever the order of these layers, the layers may be deposited by any of a variety of conventional techniques, such as, via vapor deposition or sputtering. Likewise, these layers may be etched by any of a variety of conventional techniques, such as, by chemical etching or sputter etching techniques.

In FIGS. 3A–B and 4A–B, there is shown a further embodiment of the "see-through" photoresist mask, in accordance with the principles of the present invention. In this latter embodiment, rather than employ a relatively thick $Al_2O_3$ layer, such as sapphire, to act as both a substrate for the $Cr_2O_3$ – ruby medium and a contributing source to the fabrication of the ruby itself, a relatively thin layer of $Al_2O_3$ is supported upon its own substrate and acts merely as a contributing source to the fabrication of the ensuing ruby layer.

Figure 3A:
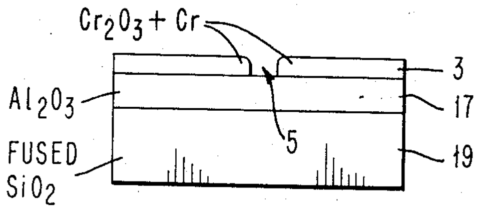
FIGS. 3A and 3B show a method of fabricating an alternative form of the photoresist mask, in accordance with the principles of the present invention.

Thus, as shown in FIG. 3A, a relatively thin layer 17 of $Al_2O_3$ is deposited upon substrate layer 19. It is clear, in this regard, that layer 19 may be any of a variety of hard substrate materials. The essential requirements are that the substrate material be refractory and hard, thermally matched to the $Al_2O_3$ layer and provide the appropriate optical properties. In particular, substrate layer 19 must be transparent in both the visible and short wavelength visible or near ultra-violet range, the latter being the sensitive range for the photoresist in question. Although any of the variety of high temperature glasses might be employed for substrate layer 19, fused $SiO_2$ has been found to be particularly effective for this purpose. Likewise, layer 17 may comprise any of a variety of $Al_2O_3$ types, such as a monocrystalline, polycrystalline or amorphous $Al_2O_3$ layer. Typically, layer 17 is an evaporated $Al_2O_3$ layer, up to several microns in thickness.

After the $Al_2O_3$ layer 17 has been evaporated upon substrate layer 19, a layer 3 of $Cr_2O_3 + Cr$ may be evaporated upon the $Al_2O_3$, as was done in the manner of FIG. 1A. Likewise, as was done in the manner of FIG. 1A, the $Cr_2O_3 + Cr$ layer 3 may be etched as shown by 5 to form the desired pattern. Thereafter, the arrangement is heated in an air or inert atmosphere, for the temperatures and times described with regard to FIGS. 1A–B. Thus, where layer 17 is a sapphire layer, relatively high temperatures and long times are required to diffuse the Cr therein.

Figure 3B:
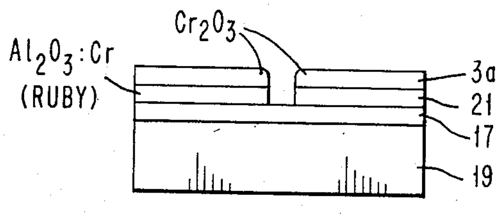

In FIG. 3B there is depicted the resultant intermediate ruby layer 21, formed by the action of diffusing at least a part of the Cr of layer 3 into $Al_2O_3$ layer 17. It is clear, that ruby layer 21 in combination with $Cr_2O_3$ layer 3a acts to provide the appropriate absorption characteristics, the same as these characteristics were obtained in regard to the arrangements of FIGS. 1A–B and 2A–B.

Figure 4A:
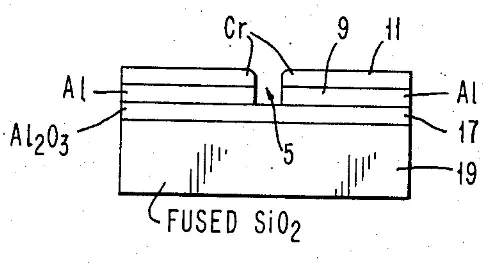
FIGS. 4A and 4B show a further method of fabricating the alternative photoresist mask, in accordance with the principles of the present invention.
Figure 4B:
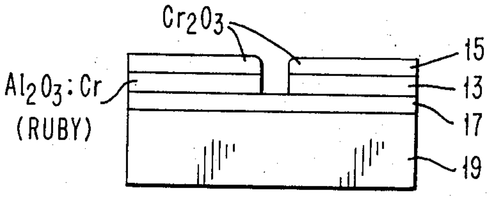

In FIGS. 4A–B there is shown an arrangement which is somewhat analogous to both FIGS. 2A–B and FIGS. 3A–B. In FIGS. 2A–B, akin to the manner of FIGS. 1A–B, the $Al_2O_3$ layer 1 such as sapphire was employed as both the substrate and contributor to the fabrication of the ruby layer. In FIGS. 4A–B, however, rather than employ the $Al_2O_3$ layer as both a substrate and a contributing source to the fabrication of the ruby layer, an arrangement analogous to FIGS. 3A–B is employed, whereby a relatively thin layer of $Al_2O_3$ is employed merely as a contributing source to the fabrication of the desired ruby layer. However, rather than employ a $Cr_2O_3 + Cr$ layer, as was done in both FIGS. 1A–B and 3A–B, both a Cr and Al layer are employed, as was done in FIGS. 2A–B. Accordingly, in FIG. 4A there is shown a relatively thin layer 17 of $Al_2O_3$, which may for example be evaporated upon substrate layer 19. Thereafter, an Al layer 9 and Cr layer 11 are deposited upon $Al_2O_3$ layer 17, and etched to the desired pattern. Then, in the same manner as was described with regard to FIGS. 2A–B, the arrangement is heated in an oxidizing atmosphere whereby the layers 9 and 11 act with $Al_2O_3$ layer 17 to form a ruby layer 13, intermediate a $Cr_2O_3$ layer 15 and the remaining portion of $Al_2O_3$ layer 17.

Although the above-described processes for doping $Al_2O_3$ with Cr rely on diffusion techniques, it is clear that other techniques may, likewise, be employed for doping the $Al_2O_3$ with Cr. For example, ion-implantation of Cr into $Al_2O_3$ might be used. Likewise, chemical vapor deposition, sputtering and electron-beam evaporation of Cr-doped $Al_2O_3$ and $Cr_2O_3$ might be used.

In particular, electron beam evaporation or sputtering, for example, may be employed to deposit a Cr-doped $Al_2O_3$ layer and a layer of $Cr_2O_3$ in either order to fabricate the desired structure of the mask on a substrate of either sapphire or fused $SiO_2$. Because subsequent treatment at high temperatures is not essential with this method, the substrate could be chosen from a wide range of glasses. As suggested, in addition to electron beam evaporation and sputtering, chemical vapor deposition processes may be used to produce the Cr-doped $Al_2O_3$ and $Cr_2O_3$ layers. Furthermore, it is evident that any of electron beam evaporation, chemical vapor deposition or sputtering processes may be used to co-deposit Cr-doped $Al_2O_3$ and $Cr_2O_3$ to form a homogeneous mixture of $Al_2O_3$:Cr and $Cr_2O_3$ which will act to provide to optical adsorption characteristics of the distant layers of these materials, as taught in accordance with the present invention.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A durable semitransparent photoresist mask for blocking light within the sensitive range of photoresist and passing sufficient light in the visible range to allow the visual alignment thereof, comprising a layer of $Al_2O_3$ having formed thereon a layer of $Cr_2O_3$, with said $Cr_2O_3$ having a pattern formed therethrough in accordance with the pattern to be exposed to the said light within said sensitive range.

2. The mask as set forth in claim 1 wherein said layer of $Al_2O_3$ includes a layered region of Cr-doped $Al_2O_3$ having a pattern formed therethrough corresponding to the said pattern in said layer of $Cr_2O_3$.

3. The mask as set forth in claim 2 wherein said layer of $Cr_2O_3$ includes free Cr.

4. The mask as set forth in claim 3 wherein said layered region of Cr-doped $Al_2O_3$ is formed by diffusing at least some of said free Cr in the said layer of $Cr_2O_3$ into the $Al_2O_3$ therebeneath in said layer of $Al_2O_3$ so as to thereby form a ruby layer in contact with said layer of $Cr_2O_3$.

5. The mask as set forth in claim 4 wherein said layer of $Al_2O_3$ is sapphire.

6. The mask as set forth in claim 4 wherein said layer of $Al_2O_3$ is a sintered polycrystalline $Al_2O_3$.

7. The mask as set forth in claim 4 wherein said layer of $Al_2O_3$ is dense alumina.

8. The mask as set forth in claim 4 wherein said layer of $Al_2O_3$ is LUCALOX.

9. A semitransparent photoresist mask for blocking light within the range of sensitivity of the photoresist material employed therewtih and at the same time being sufficiently transparent to light within the visible range to allow the visual alignment thereof, comprising:

a first layer of $Al_2O_3$ at least a portion of which is transparent to light within the visible range;

a second layer of Cr-doped $Al_2O_3$ formed on said first layer and having a pattern formed therethrough to said first layer, and a third layer of $Cr_2O_3$ formed on said second layer and having the same pattern formed therethrough as said second layer so that said second and third layers cooperatively act to block light within the said range of sensitivity of the photoresist and at the same time transmit sufficient light to allow the said visual alignment thereof.

10. The mask as set forth in claim 9 wherein said layer of Cr-doped $Al_2O_3$ is formed by diffusing Cr from said layer of $Cr_2O_3$ into said layer of $Al_2O_3$.

11. The mask as set forth in claim 9 wherein said layer of $Al_2O_3$ is formed on a substrate of hard crystalline material which is transparent to light in the visible range.

12. The mask as set forth in claim 9 wherein said layer of $Al_2O_3$ is formed on a substrate of hard amorphous material which is transparent to light in the visible range.

13. The mask as set forth in claim 12 wherein said amorphous material is fused $SiO_2$.

14. The mask as set forth in claim 9 wherein said layer of $Al_2O_3$ is sapphire.

15. The mask as set forth in claim 9 wherein said layer of $Al_2O_3$ is sintered polycrystalline $Al_2O_3$.

16. The mask as set forth in claim 9 wherein said range of sensitivity is approximately 3,000 A to 4,500 A.

* * * * *